(12) United States Patent  
Ambroladze et al.

(10) Patent No.: US 8,365,055 B2  
(45) Date of Patent: Jan. 29, 2013

(54) HIGH PERFORMANCE CACHE DIRECTORY ERROR CORRECTION CODE

(75) Inventors: Ekaterina M. Ambroladze, Wrappingers Fall, NY (US); Patrick J. Meaney, Poughkeepsie, NY (US); Arthur J. O'Neill, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 12/822,889

(22) Filed: Jun. 24, 2010

(65) Prior Publication Data

US 2011/0320919 A1    Dec. 29, 2011

(51) Int. Cl.  
*H03M 13/00* (2006.01)  
*G11C 29/00* (2006.01)

(52) U.S. Cl. ........ 714/785; 714/752; 714/763; 714/768; 714/769; 714/799; 714/781

(58) Field of Classification Search .................. 714/752, 714/763, 768, 769, 799, 781, 785  
See application file for complete search history.

(56) References Cited

U.S. PATENT DOCUMENTS

| 5,353,059 | A | * | 10/1994 | Lawlor et al. | 375/240.11 |
| 5,631,915 | A | * | 5/1997 | Meaney et al. | 714/763 |
| 5,774,481 | A | * | 6/1998 | Meaney et al. | 714/763 |
| 6,009,548 | A | * | 12/1999 | Chen et al. | 714/762 |
| 6,457,154 | B1 | | 9/2002 | Chen et al. | |
| 6,460,157 | B1 | | 10/2002 | Chen et al. | |
| 6,463,563 | B1 | | 10/2002 | Chen et al. | |
| 6,519,736 | B1 | | 2/2003 | Chen et al. | |
| 7,502,986 | B2 | * | 3/2009 | O'Neill et al. | 714/769 |
| 7,721,178 | B2 | | 5/2010 | Dell et al. | |
| 2006/0179394 | A1 | | 8/2006 | O'Neill et al. | |
| 2007/0283207 | A1 | | 12/2007 | Dell et al. | |
| 2007/0283208 | A1 | | 12/2007 | Dell et al. | |
| 2007/0283223 | A1 | | 12/2007 | Dell et al. | |
| 2007/0283229 | A1 | | 12/2007 | Dell et al. | |
| 2009/0164874 | A1 | * | 6/2009 | O'Neill et al. | 714/785 |

OTHER PUBLICATIONS

NN8812191, Logical Decoupling of Parallel Error Correction Code Banks With Invert-Retry and Simultaneous Timings, Dec. 1, 1988, IBM Technical Disclosure Bulletin, vol. 31, Issue 7, pp. 191-195.*

* cited by examiner

*Primary Examiner* — John J Tabone, Jr.  
(74) *Attorney, Agent, or Firm* — Cantor Colburn LLP; John Campbell

(57) ABSTRACT

Defining a set of correctable error and uncorrectable error syndrome code points, generating an error correction code (ECC) syndrome decode, regarding the uncorrectable error syndrome code points as "don't cares" and logically minimizing the ECC syndrome decode for the determination of the correctable error syndrome code points based on the regarding of the uncorrectable error syndrome code points as the "don't cares" whereby output data can be ignored for the uncorrectable error syndrome code points.

20 Claims, 8 Drawing Sheets

FIG. 5

```
21/15 ECC HMATRIX code

EEEEEE
                                     CCCCCC
                                     CCCCCC
        Data                         012345
------------------|------|------|------
000111001011001   |100000
100011100101100   |010000
110001110010010   |001000
111000011001101   |000100
011100101100110   |000010
001110010110011   |000001
------------------|------|------|------
000000000011111   111112
012345678901234   567890
         ▲
         │ 503
         ▲
           ─── 500
```

FIG. 7

```
$c1_ecc_flip_data(0)  <= eq(c1_ecc_syn, "-111--");
$c1_ecc_flip_data(1)  <= eq(c1_ecc_syn, "--111-");
$c1_ecc_flip_data(2)  <= eq(c1_ecc_syn, "---111");
$c1_ecc_flip_data(3)  <= eq(c1_ecc_syn, "1---11");
$c1_ecc_flip_data(4)  <= eq(c1_ecc_syn, "11---1");
$c1_ecc_flip_data(5)  <= eq(c1_ecc_syn, "111---");
$c1_ecc_flip_data(6)  <= eq(c1_ecc_syn, "-11-1-");
$c1_ecc_flip_data(7)  <= eq(c1_ecc_syn, "--11-1");
$c1_ecc_flip_data(8)  <= eq(c1_ecc_syn, "1--11-");
$c1_ecc_flip_data(9)  <= eq(c1_ecc_syn, "-1--11");
$c1_ecc_flip_data(10) <= eq(c1_ecc_syn, "1-1--1");
$c1_ecc_flip_data(11) <= eq(c1_ecc_syn, "11-1--");
$c1_ecc_flip_data(12) <= eq(c1_ecc_syn, "-1-11-");
$c1_ecc_flip_data(13) <= eq(c1_ecc_syn, "--1-11");
$c1_ecc_flip_data(14) <= eq(c1_ecc_syn, "1--1-1");

$c1_ecc_flip_ecc(0)   <= (c1_ecc_syn = "1-0000");
$c1_ecc_flip_ecc(1)   <= (c1_ecc_syn = "-10000");
$c1_ecc_flip_ecc(2)   <= (c1_ecc_syn = "001-00");
$c1_ecc_flip_ecc(3)   <= (c1_ecc_syn = "00-100");
$c1_ecc_flip_ecc(4)   <= (c1_ecc_syn = "00001-");
$c1_ecc_flip_ecc(5)   <= (c1_ecc_syn = "0000-1");
```

FIG. 8

| KMAP | 1000 | 1001 | 1011 | 1010 | 1100 | 1101 | 1111 | 1110 |
|------|------|------|------|------|------|------|------|------|
| 00   |      | CE   | CE   | UE   |      | UE   | UE   |      |
| 01   |      | UE   | UE   | CE   |      | CE   | UE   | UE   |
| 11   |      | CE   | UE   | CE   |      | UE   | CE   | UE   |
| 10   |      | UE   | CE   | UE   |      | UE   | UE   | UE   |

100011

| KMAP | 1000 | 1001 | 1011 | 1010 | 1100 | 1101 | 1111 | 1110 |
|------|------|------|------|------|------|------|------|------|
| 00   |      | CE   | CE   | UE   |      | UE   | UE   |      |
| 01   |      | UE   | UE   | CE   |      | CE   | UE   | UE   |
| 11   |      | CE   | UE   | CE   |      | UE   | CE   | UE   |
| 10   |      | UE   | CE   | UE   |      | UE   | UE   | UE   |

10-011

| KMAP | 1000 | 1001 | 1011 | 1010 | 1100 | 1101 | 1111 | 1110 |
|------|------|------|------|------|------|------|------|------|
| 00   |      | CE   | CE   | UE   |      | UE   | CE   |      |
| 01   |      | UE   | UE   | CE   |      | CE   | UE   | UE   |
| 11   |      | CE   | UE   | CE   |      | UE   | CE   | UE   |
| 10   |      | UE   | CE   | UE   |      | UE   | CE   | CE   |

1---11 ic Cache Directory Error Correction Code

BACKGROUND

This invention relates generally to processing within a computing environment and, more particularly, to high performance cache directory error correction code (ECC) optimization.

In computing environments, the last few decades have been characterized by steady increases in processing speeds, which are represented by faster and faster cycle times. While this trend certainly offers benefits in terms of the usefulness of the computing environments for many applications, as cycle times have been pushed faster and faster, cache sizes have been forced to grow in size and capacity. The current caches may be, therefore, expensive and may frequently demand relatively large power supplies and relatively large portions of computing resources.

A result of the increase in cache size has been that generation of a directory hit in only one cycle has become increasingly unlikely despite the fact that not completing this type of action in one cycle requires that relatively large banks of latch registers must be provided to hold the look-up data from the directory or the partial hit determination. It is also advantageous to generate the hit as quickly as possible as this is a gating condition to a reading of the cache data out of the correct compartment in the cache. The amount of time it takes to read data out of the cache directly impacts when data is returned to the requestor (i.e., core) and, thus, the performance of the cache. The data is often appended with directory address tags, which are stored in, for example, static random access memory units (SRAMs) that are unfortunately vulnerable to soft fails and physical defects. Because of this, the address is stored with an ECC so that these errors can be detected and corrected.

BRIEF SUMMARY

In accordance with an aspect of the invention, a computer program product for employing error correction code (ECC) operation is provided and includes a tangible storage medium readable by a processing circuit and storing instructions for execution by the processing circuit for performing a method including defining a set of correctable error and uncorrectable error syndrome code points, generating an error correction code (ECC) syndrome decode, regarding the uncorrectable error syndrome code points as "don't cares" and logically minimizing the ECC syndrome decode for the determination of the correctable error syndrome code points based on the regarding of the uncorrectable error syndrome code points as the "don't cares" whereby output data can be ignored for the uncorrectable error syndrome code points.

In accordance with another aspect of the invention, an apparatus for error correction code (ECC) correction is provided and includes a storage unit in which data is stored with an associated ECC for use in an ECC system, a syndrome generator in signal communication with the storage unit to define a set of correctable error and uncorrectable error syndrome code points, generate an error correction code (ECC) syndrome decode, regard the uncorrectable error syndrome code points as "don't cares" and logically minimize the ECC syndrome decode for the determination of the correctable error syndrome code points based on the regarding of the uncorrectable error syndrome code points as the "don't cares" whereby output data can be ignored for the uncorrectable error syndrome code points and a flip controller to flip a data bit of the data in accordance with the logic minimization of the syndrome generator.

In accordance with yet another aspect of the invention, a computer implemented method of error correction code (ECC) correction is provided and includes using uncorrectable code points as "don't cares" to apply logic minimization of the ECC syndrome to thereby form a shortest possible notation of the ECC syndrome decodes, identifying correctable and uncorrectable code points using the shortest possible notation of the ECC syndrome decodes and applying data flips to data bits represented by the correctable code points identified by the use of the shortest possible notation of the ECC syndrome decodes.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES in which:

FIG. 5 is an exemplary H-matrix;

FIG. 7 is a listing of all of the ECC optimized syndrome decodes for the H-matrix of FIG. 5; and FIG. 8 illustrates an application of ECC optimization with a syndrome having been identified.

DETAILED DESCRIPTION

In accordance with aspects of the invention, if error correction code (ECC) logic correcting data detects an uncorrectable error (UE), it may be generally advantageous to provide a way to detect a UE on the data and to ignore the data output for a UE condition. This may include performing a checkstop operation, fencing off the data or flagging the data with a UE pattern or flag. In an exemplary embodiment in accordance with the invention, a cache may be protected with ECC and the invention can be used to minimize fetch logic at the output of the cache. In another exemplary embodiment in accordance with the invention, a cache directory which is designed to checkstop on directory UEs may be protected with ECC and the invention can be used to minimize fetch logic at the output of the directory logic prior to the hit logic. These scenarios can then be exploited in that uncorrectable error (UE) syndromes are used as instances of "don't cares" in order to minimize a number of bits that have to be decoded to generate flip bits for directory, cache or interface errors.

Figure 1:
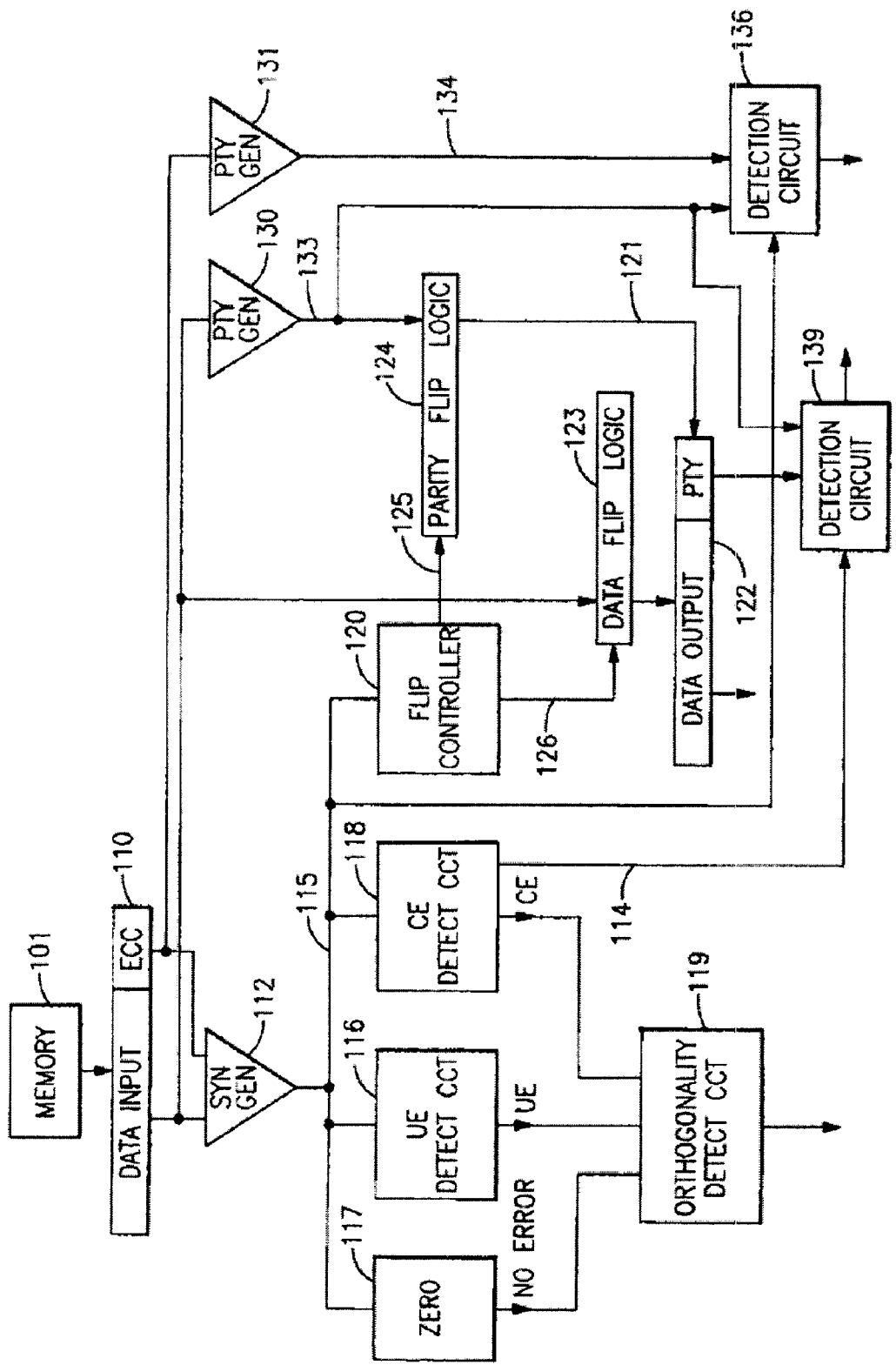
FIG. 1 is a block diagram representation of error detection and correction circuitry incorporating principles of the invention

FIG. 1 is a block diagram representation of error detection and correction circuitry. As shown, the circuitry includes a data input register 110 in which data and an error control (or correction) code (ECC) are received from a memory 101, such as a non-transitory computer readable medium, in a standard memory read operation.

In one exemplary aspect of the invention, ECC may be used on data stored in a cache, memory device or on an interface bus. In such cases, it is often advantageous to detect uncorrectable errors (UEs) independent of the corrected data. Also, in such cases, the output data can be ignored when the data results in an uncorrectable error.

Figure 2:
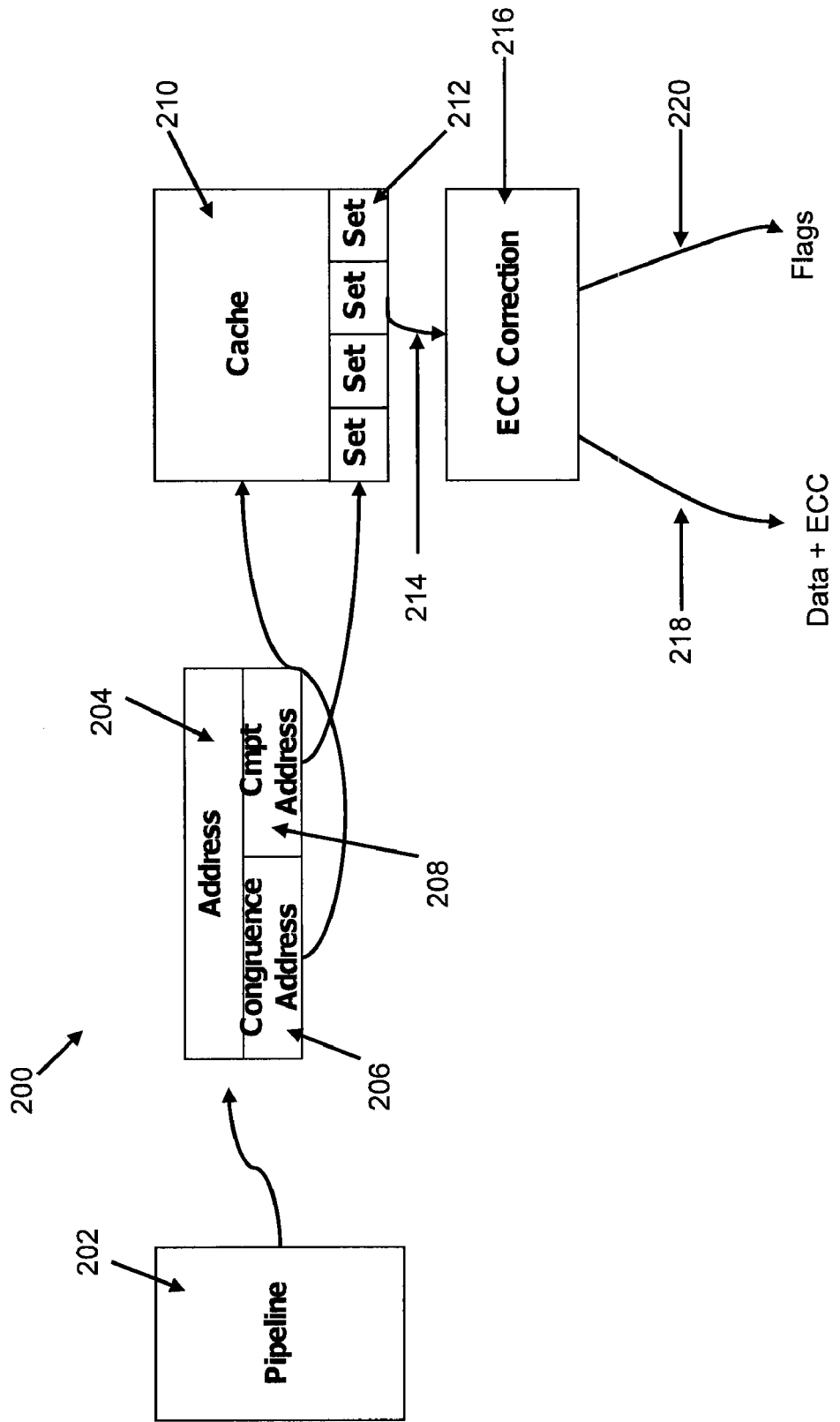
FIG. 2 is a schematic illustration of a cache ECC structure.

FIG. 2 is a schematic illustration of a cache ECC structure 200. As shown in FIG. 2, a set of instructions are provided in a pipeline 202. Each data word of those instructions is then arranged and organized by address 204. This address has a congruence address component 206 and a set (or compartment) address component 208. The data words are then stored in the cache 210 according to their congruence address 206 and then according to their set address 208. The congruence address 206 and set address 208 are used to access a line of data in a corresponding set in the cache 210 from a set location 212 via an output bus 214 to an error correction station 216. The ECC station 216 detects and corrects errors in the data onto output bus 218 and generates ECC status flags 220.

In another exemplary aspect of the invention, ECC may be used on data stored in a cache directory. In such case, it is often advantageous to detect uncorrectable errors (UEs) independent of the corrected data and to checkstop when such UE occurs to avoid a data integrity scenario. In such a case, the output data can be ignored when the data results in an uncorrectable error.

Figure 3:
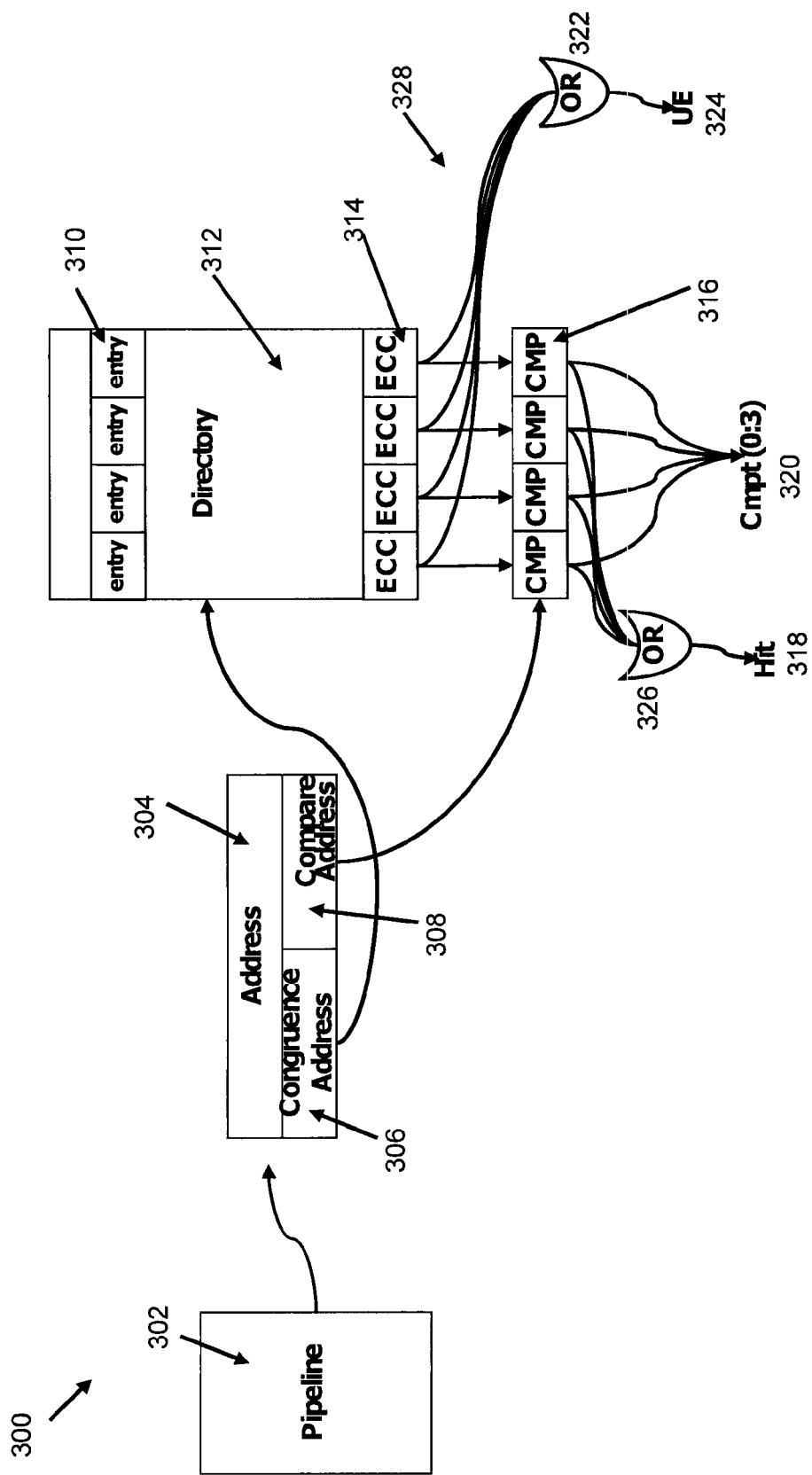
FIG. 3 is a schematic illustration of a cache directory ECC structure.

FIG. 3 is a schematic illustration of a cache directory ECC structure 300. As shown in FIG. 3, a set of instructions are provided in a pipeline 302. Each data word of those instructions includes an address 304. This address has a congruence address component 306 and a compare address component 308. The congruence address 306 is used to select a plurality of congruence class directory entries 312 from the directory 310 into a plurality of error correction code (ECC) stations 314. Output data of each of said ECC stations 314 is compared with the compare address 308 using hit compare logic 316 to create a hit signal 318 and set address 320. The set address 320 is a representation of the location of the set whose address matched the compare address 308. The hit signal 318 is generated by, e.g., ORing, the compare status of compare logic 316 using OR circuit 326 and indicates that a line with address 304 exists in the cache 210. Status 328 of ECC stations 314 are ORed together with OR circuit 322 to generate output UE status 324.

Referring back to FIG. 1, for the purposes of error detection and correction for the data and the ECC, a syndrome of the data and the ECC is generated by a syndrome generator 112 according to known methods. The output of the syndrome generator 112 is connected via a bus 115 to an uncorrectable-error (UE) detection circuit 116, a zero detect circuit 117, a correctable-error (CE) detection circuit 118, and a flip controller 120. The zero detect circuit 117 provides an output when the syndrome includes all zeroes, which may be defined as a no-error condition. The outputs of the zero detect circuit 117, the UE detect circuit 116, and the CE detect circuit 118 may be tested for orthogonality (i.e., that one and only one of these three circuits generates an output signal for each tested syndrome) in orthoganality detect circuit 119. Orthoganality detection circuit 119 may be a standard logic circuit generating an error output when the orthogonality condition is not satisfied.

The data input register 110 is also connected to data flip logic 123. The flip controller 120 decodes the syndrome obtained from the syndrome generator 112 via the bus 115 and generates an appropriate output when the syndrome indicates a correctable error in a bit location of the data in memory register 110. The output of flip controller 120 is used to change the polarity of a specific bit identified by the syndrome in order to correct the data in the data flip logic 123. The corrected output of flip logic 123 is gated to the data output register 122.

When data is written into memory, a new ECC is generated by a check bit generation circuit (not shown). The check bit generation circuit and the syndrome generator 112 typically include a group of parity generators, such as exclusive-nor (XNOR) circuits. The generated check bits are stored in memory with the data word. When the data word is again retrieved from memory, the data and the accompanying ECC code is stored in the data input register 110. The syndrome generator 112 is essentially a check bit generator which operates on the data and the ECC bits to generate the syndrome. A pair of parity generators 130, 131 are connected between data input register 110. The parity generator 130 generates byte parity over each byte of an input data word and parity generator 131 generates parity over the ECC received from memory in the data input register 110. The output of the byte parity generator 130 is connected to a parity flip logic 124 via byte parity bus 133. The parity flip logic 124 is connected via a plurality of input conductors 125 to the flip controller 120.

In the event that the polarity of one of the parity bits needs to be reversed, a signal from flip the controller 120 on one of the conductors 125 changes the appropriate bit in the flip parity logic 124. The output of the flip parity logic 124 is stored in the parity position of the data output register 122 via conductor 121.

The ECC parity generated on busses 133 and 134 by parity generators 130 and 131, respectively, and the syndrome on syndrome bus 115 are transmitted to a detection circuit 136. The purpose of the detection circuit 136 is to perform a crosscheck of the syndrome generator 112. In a similar fashion, detection circuit 139, connected to the parity output of register 122, parity generator 130, and a data output of CE detect circuit 118 on conductor 114, provides a cross-check of the parity flip logic 124 and CE detect circuit 118. As described later herein with reference to FIG. 3, the output of CE detect circuit 118 on conductor 114 represents data of correctable errors only. Additionally, the data flip logic 123 can be cross-checked using a byte parity check across data output register 122.

Figure 4:
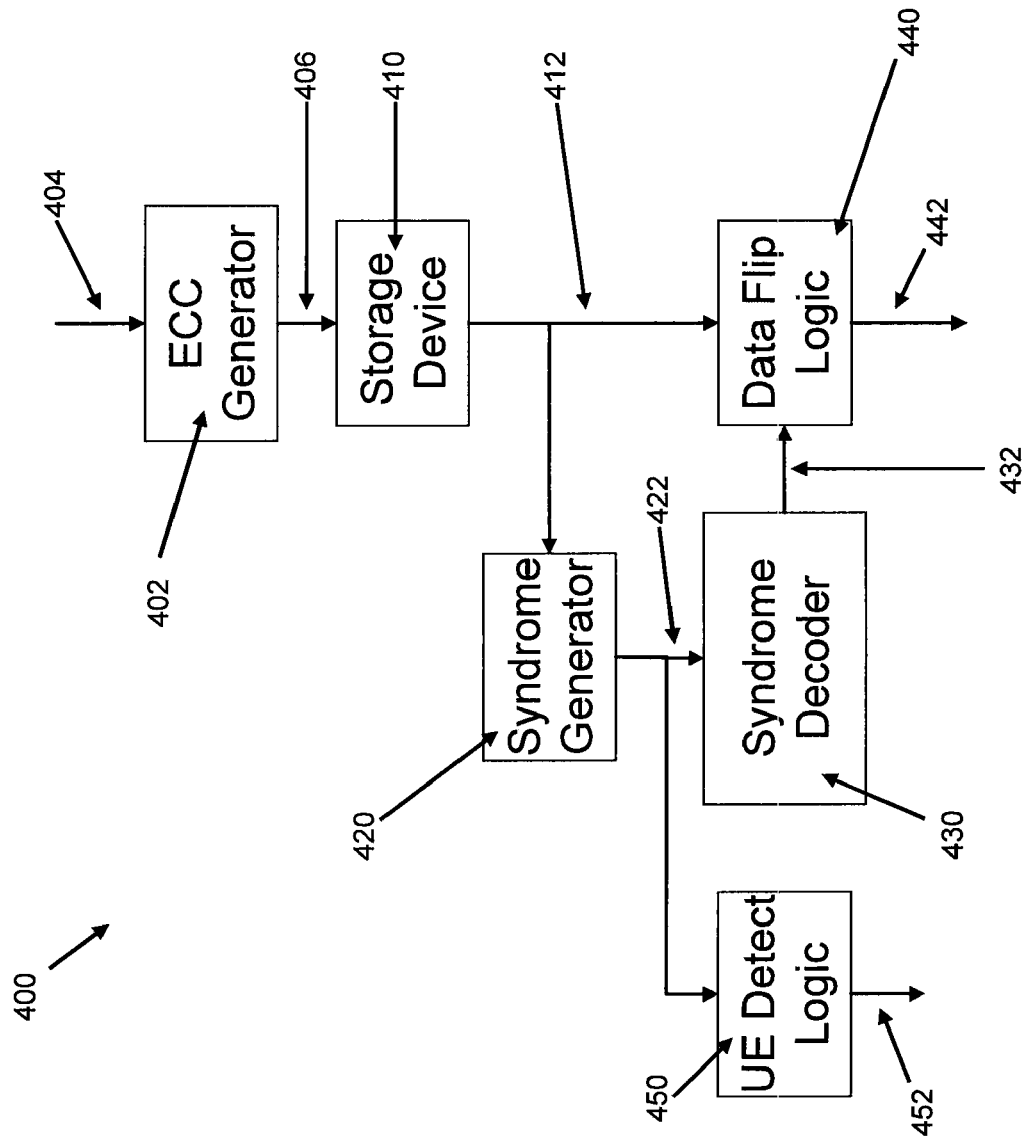
FIG. 4 is a flow diagram illustrating an ECC optimization in accordance with embodiments.

FIG. 4 is a block diagram of a data ECC protection system 400. ECC generation logic 402 receives original data 404 and generates check bits 406 using for example an H-matrix as is known in the art and stores original data 404 with check bits 406 into storage device 410. Storage device output data 412 is used by syndrome generator 420 to generate an ECC syndrome 422 using for example an H-Matrix as is known in the art. Syndrome decoder 430, which is analogous to the flip controller 120 of FIG. 1, is used to generate flip controls 432 which flip storage device output data 412 using data flip logic 440 to generated corrected data 442. The decoding of the syndrome in the optimal fashion will be described below.

FIG. 5 is a representation of an exemplary H-matrix for a single error correcting/double error detecting (SEC/DED) code for protecting a data word in 21/15 code used in, for example, a cache directory. The basic properties and implementation of the H-matrix are well known and it is understood that a number of different H-matrices may be generated within specified constraints, such as the minimum number of check bits required for a selected number of data bits for error detection.

As shown in FIG. 5, the H-matrix includes rows of data words in 0, 1, 2, . . . , 20 columns. The columns 0 to 14 are data columns and correspond to a bit in the data word, and the columns 15 through 20 are the ECC columns and correspond to a bit in the ECC check bits. Each row of the matrix represents a parity group. The '1s' in each row indicate which data bits are used to generate the check bit except for the last '1' which indicates the position of the ECC check bit. All of the data bits indicated in each check bit parity group except the check bit itself are then used to generate the ECC check bits. When the data word and ECC bits are checked the parity of the entire parity group is checked including the check bit to determine the syndrome.

Figure 6:
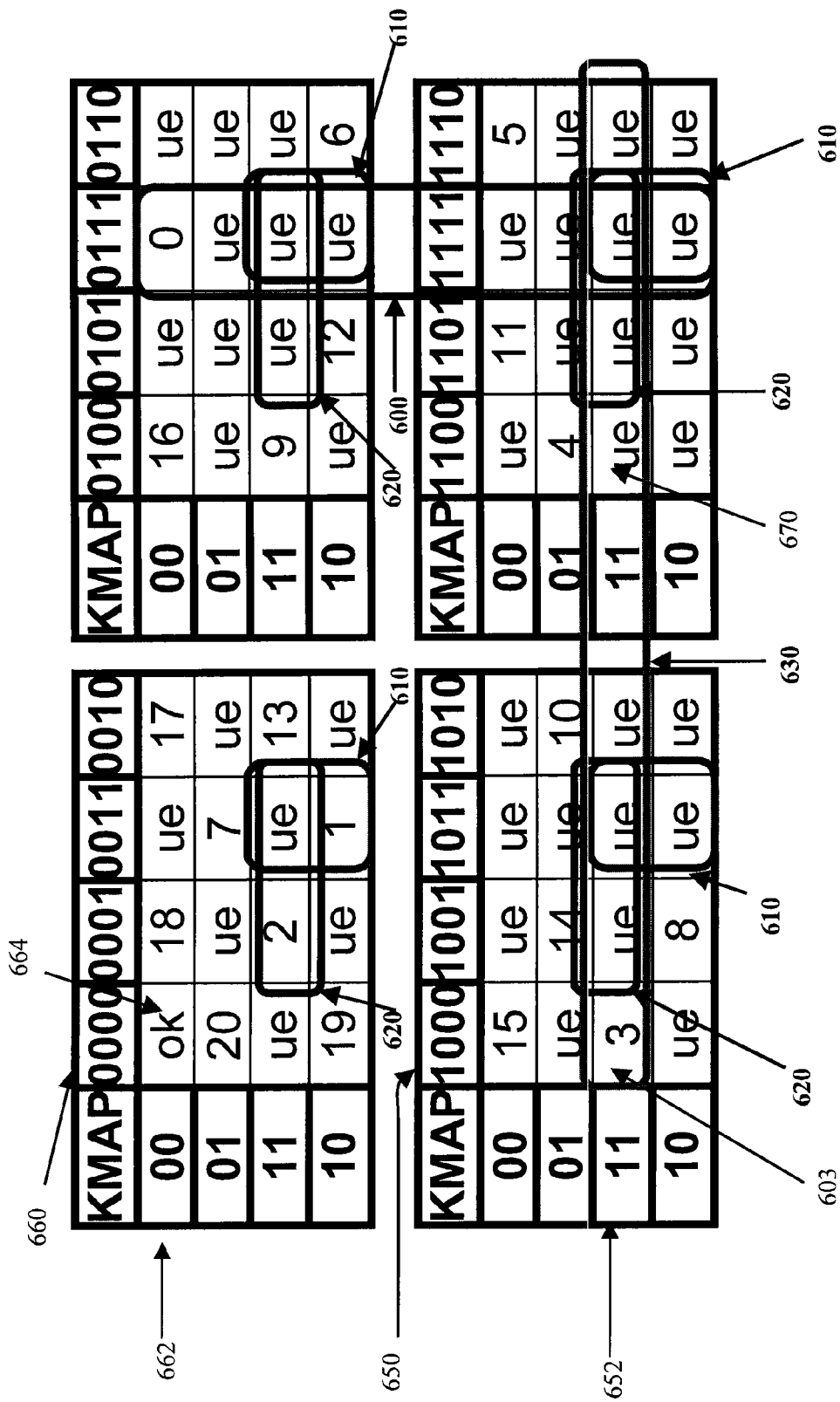
FIG. 6 is an exemplary Karnough map for the H-matrix of FIG. 5.

In this way, the H-matrix of FIG. 5 may be employed to describe how to build an ECC system and serves to describe all correctable errors in the ECC system. For example, if the syndrome generator decodes a 6 bit syndrome, the H-matrix may be mapped into the Karnough map (KMAP) shown in FIG. 6 although it is understood that other schemes are available. As shown in FIG. 6, each of the four matrices of the KMAP has a column header that sets forth the various combinations of the first four bits of the 6 bit syndrome and a row header that sets forth the last two bits. The KMAP allows one to map the correctable errors (bit #), the uncorrectable errors (ue) and the non-failing scenario (ok) of the H-matrix.

For instance H-matrix column for data bit 3 503 (see FIG. 5) contains the syndrome vector (reading vertically down the column) of '100011'. Mapping this to the KMAP in FIG. 6, the first four bits '1000' are mapped to KMAP column '1000' 650 and the last two bits '11' are mapped to KMAP row '11' 652 to select location '3' 603 to represent data bit 3. Likewise, all correctable errors can be mapped to locations in the KMAP. Since '000000' represents correct data, we map KMAP column '0000' 660 and KMAP row '00' 662 to select location 'ok' 664. All remaining cells are designated uncorrectable errors 'ue'. For instance, observe that none of the H-matrix columns in FIG. 5 contain '110011' which is mapped to location 'ue' 670. That is, every code point in the KMAP should be mapped to 'bit #', 'ue', or 'ok' based on the H-matrix.

Referring back to FIG. 4, normally, it is required that the syndrome decoder 430 decodes each correctable error (CE) syndrome 422 completely, without minimization, in order to precisely flip a data bit 412 only when that storage device data bit 412 is in error. This is to avoid data integrity issues with use of the corrected data 442.

However, knowing that the corrected data 442 will be ignored in the case of a UE, we can then assume that corrected data 442 does not matter in the case of a UE. This means that UEs can be used as "don't cares" in the logic minimization of the CEs. Applying principles of digital logic design minimization, we can reduce the CE terms using some, all or none of the UE terms, whichever minimizes the logic the most.

Turning to FIG. 5, notice again that the syndrome for data bit 3 is '100011' according to the column for data bit 3 503. Next, turning to the KMAP in FIG. 6, we use graphical techniques to look to maximize the region of coverage which includes bit 3 and any combination of 'ue' locations, while excluding all 'ce/bit#' and 'ok' locations. Notice that the entire KMAP row 652 includes only 'ue' locations as well as bit 3. Therefore, we can group all eight of these locations into a bit 3 grouping 630 representing a minimized implementation of bit 3 decode. Notice that this entire row has '11' for the last two bits as defined in the '11' row 652. Also, notice that the eight column headers have all eight combinations of '1XXX'. Therefore, the reduced decode for bit 3 can be represented by '1XXX11'. The remaining CEs can be minimized in a similar fashion. It is important to note that the determination of UE condition does not use this minimized decode logic. The UE detection can be implemented using prior art techniques. FIG. 7 shows a vhdl implementation of the reduced flip bit decodes.

For example, it may be assumed that a normal decode of the ECC syndrome to determine if bit 3 needs to be flipped is flip(3)<=syn(0:5)="100011", and that all of the even codepoints are assigned to the UE's, where UE syndromes are 100111, 101011, 110011, 111111. It is further assumed that an H-matrix for the ECC syndrome has avoided, by, e.g., reallocation of data, which will be discussed below, using all of the codepoints that will affect 5 of the syndrome bits: 101111 and 110111. Here, all of the syndromes where syn="1XXX11" are either unused or UE syndromes that may be treated as "don't cares" except for the syndrome itself, which indicates that bit 3 should be flipped. This make it possible to only look at those first three bits indicated with a 1 to determine if any particular bit, such as bit 3, needs to be flipped. That is, flip(3)<=syn(0)="1" AND syn(4:5)="11" and, by decoding three bits as opposed to 6 bits, valuable time when determining the hit can be saved.

With this in mind and still referring to FIG. 6, it is seen that the logic minimization routine of the ECC correction described above may be conducted on data bits 0, 1, 2 or 3 and by grouping in lateral or vertical directions and/or from KMAP to KMAP. Thus, syndrome $c1_ecc_flip_data (0)<=eq(c1_ecc_syn, "-111--") may be decoded for group 600, such that the 0111, 00 code point can be identified as being representative of a flip bit with 7 UE's regarded as "don't cares", syndrome $c1_ecc_flip_data(1)<=eq (c1_ecc_syn, "--111-") may be decoded for groups 610, such that code point 0011, 10 can be identified as being representative of a flip bit with 7 UE's regarded as "don't cares", syndrome $c1_ecc_flip_data(2)<=eq(c1_ecc_syn, "---111") may be decoded for groups 620, such that the 0001, 11 code point can be identified as being representative of a flip bit with 7 UE's regarded as "don't cares" and syndrome $ c1_ecc_flip_data(3)<=eq(c1_ecc_syn, "1---11") may be decoded for group 630, such that code point 0000, 11 can be identified as being representative of a flip bit with 7 UE's regarded as "don't cares". A listing of all of the ECC optimized syndrome decodes is provided in FIG. 7 for the H-matrix of FIG. 5.

FIG. 8 illustrates an application of ECC optimization with a syndrome of 10011 having been identified for data bit 3 (physical bit 25). Here, the full syndrome decode identifies the correctable error at the 1000, 11 code point. By contrast, a shortened version of the syndrome decode may be 10-011 to identify the correctable error for the bit represented at the 1000, 11 code point and the UE at the 1010, 11 code point, which is regarded as a "don't care". In this case, upon the data being read out, the flip bit represented by the 1000, 11 code point may be parity flipped by necessity with the bit having the UE at the 1010, 11 code point also either parity flipped or left alone. In either case, the UE is regarded as a "don't care" and the output is to be ignored.

In accordance with further embodiments, the data represented by the 1011, 11 code point, the 1101, 11 code point and the 1110, 11 code point are identified as correctable errors but can be rearranged or re-allocated within the cache directory and the H-matrix of FIG. 5 in accordance with known methods such that the Karnough map is re-ordered as shown in the third map of FIG. 8. Here, the correctable errors within data bit 3 have been moved from the 1011, 11 code point, the 1101, 11 code point and the 1110, 11 code point, respectively. As such, the syndrome decode can be shortened further to 1-11 as shown. In this way, only a single correctable error is identified along with four additional UE's.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all features in the claims below are intended to include any structure, material or act for performing the operation in combination with other claimed features as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more non-transitory computer readable medium(s) having computer readable program code embodied thereon.

Any combination of one or more non-transitory computer readable medium(s) may be utilized. The non-transitory computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible or non-transitory medium that can contain, or store a program for use by or in connection with an instruction execution system, apparatus, or device. The computer readable storage medium does not include signals, carrier waves or any other transitory media.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, cause execution of the operations/acts specified in the flowchart and/or block diagram block or blocks.

These computer program instructions may also be stored in a non-transitory computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams illustrate architecture, functionality and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer program product for employing error correction code (ECC) operation, comprising a computer readable storage medium readable by a processing circuit and storing instructions for execution by the processing circuit for performing a method comprising:
  defining a set of correctable error and uncorrectable error syndrome code points;
  generating an error correction code (ECC) syndrome decode;
  regarding the uncorrectable error syndrome code points as "don't cares"; and
  logically minimizing the ECC syndrome decode for the determination of the correctable error syndrome code points based on the regarding of the uncorrectable error syndrome code points as the "don't cares" whereby output data can be ignored for the uncorrectable error syndrome code points.

2. The computer program product according to claim 1, wherein the logically minimizing comprises Karnough mapping.

3. The computer program product according to claim 1, wherein the generating of the ECC syndrome decode comprises decoding an ECC syndrome to which the logic minimization is applied.

4. The computer program product according to claim 3, wherein the logically minimizing comprises determining a shortest possible notation of the ECC syndrome decode.

5. The computer program product according to claim 4, wherein the shortest possible notation of the ECC syndrome decode comprises an identification of a reduced number of ECC syndrome decode bits.

6. The computer program product according to claim 4, wherein the method further comprises applying the shortest possible notation of the ECC syndrome decode to identify correctable and uncorrectable error syndrome code points as representing data to be flipped.

7. The computer program product according to claim 4, wherein the method further comprises re-allocating data in the ECC system to avoid identifying correctable error syndrome code points by applying the shortest possible notation of the ECC syndrome decode.

8. An apparatus for error correction code (ECC) correction, the apparatus comprising:
  a storage unit in which data is stored with an associated ECC for use in an ECC system;
  a syndrome decoder in signal communication with the storage unit to define a set of correctable error and uncorrectable error syndrome code points, generate an error correction code (ECC) syndrome decode, regard the uncorrectable error syndrome code points as "don't cares" and logically minimize the ECC syndrome decode for the determination of the correctable error syndrome code points based on the regarding of the uncorrectable error syndrome code points as the "don't cares" whereby output data can be ignored for the uncorrectable error syndrome code points; and
  data flip logic to flip a data bit of the data in accordance with the logic minimization of the syndrome decoder.

9. The apparatus according to claim 8, wherein the logic minimization comprises Karnough mapping.

10. The apparatus according to claim 8, wherein the syndrome decoder decodes an ECC syndrome to which the logic minimization is applied.

11. The apparatus according to claim 10, wherein the logic minimization comprises determining a shortest possible notation of the ECC syndrome decode.

12. The apparatus according to claim 11, wherein the shortest possible notation of the ECC syndrome decode comprises a reduced number of ECC syndrome decode bits.

13. The apparatus according to claim 11, wherein the syndrome decoder applies the shortest possible notation of the ECC syndrome decode to identify correctable and uncorrectable error syndrome code points as representing data to be flipped.

14. The apparatus according to claim 11, wherein the data flip logic flips data bits having correctable and uncorrectable errors.

15. The apparatus according to claim 11, wherein the data is re-allocated within the storage unit to avoid identifying correctable error syndrome code points by applying the shortest possible notation of the ECC syndrome decode.

16. A computer implemented method of error correction code (ECC) correction, the method comprising:
  decoding an ECC syndrome;
  using uncorrectable code points as "don't cares" to apply logic minimization of the ECC syndrome to thereby form a shortest possible notation of the ECC syndrome decodes;
  identifying correctable and the uncorrectable code points using the shortest possible notation of the ECC syndrome decodes; and
  applying data flips to data bits represented by the correctable code points identified by the use of the shortest possible notation of the ECC syndrome decodes.

17. The computer implemented method according to claim 16, wherein the shortest possible notation of the ECC syndrome comprises an identification of a lesser number of ECC syndrome bits.

18. The computer implemented method according to claim 16, further comprising ignoring output data for the uncorrectable errors.

19. The computer implemented method according to claim 16, wherein the logic minimization of the method comprises Karnough mapping.

20. The computer implemented method according to claim 16, further comprising re-allocating data to avoid identifying correctable code points by the use of the shortest possible notation of the ECC syndrome.

* * * * *